United States Patent
Lang et al.

(10) Patent No.: US 7,435,684 B1
(45) Date of Patent: Oct. 14, 2008

(54) RESOLVING OF FLUORINE LOADING EFFECT IN THE VACUUM CHAMBER

(75) Inventors: Chi-I Lang, Sunnyvale, CA (US); Ratsamee Limdulpaiboon, Daly City, CA (US); Kan Quan Vo, San Jose, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 11/493,678

(22) Filed: Jul. 26, 2006

(51) Int. Cl.
*H01L 21/311* (2006.01)

(52) U.S. Cl. .............................. 438/695; 257/E21.278; 257/E21.546; 257/E21.547; 438/788

(58) Field of Classification Search ................ 428/706, 428/689, 710, 714; 438/706, 689, 710, 714, 438/787, 424, 694, 695, 788; 257/E21.278, 257/E21.546, E21.547
See application file for complete search history.

(56) References Cited

U.S. PATENT DOCUMENTS

| | | | |
|---|---|---|---|
| 6,492,258 B1 | 12/2002 | Van Ngo et al. | |
| 6,616,985 B2 | 9/2003 | Powell et al. | |
| 6,667,248 B2 | 12/2003 | M'Saad et al. | |
| 6,846,745 B1 * | 1/2005 | Papasouliotis et al. | 438/706 |
| 6,883,733 B1 | 4/2005 | Lind | |
| 7,183,214 B2 * | 2/2007 | Nam et al. | 438/694 |
| 2007/0072422 A1 * | 3/2007 | Yeh | 438/689 |

* cited by examiner

Primary Examiner—Asok K Sarkar
(74) Attorney, Agent, or Firm—DeLio & Peterson, LLC

(57) ABSTRACT

This invention relates to electronic device fabrication processes for making devices such as semiconductor wafers and resolves the fluorine loading effect in the reaction chamber of a HDP CVD apparatus used for forming dielectric layers in high aspect ratio, narrow width recessed features. The fluorine loading effect in the chamber is minimized and wafers are provided having less deposition thickness variations by employing the method using a hydrogen plasma treatment of the chamber and the substrate after the chamber has been used to grow a dielectric film on a substrate. After the hydrogen plasma treatment of the chamber, the chamber is treated with an etchant gas to etch the substrate. Preferably a hydrogen gas is then introduced into the chamber after the etching process and the process repeated until the fabrication process is complete. The wafer is then removed from the chamber and a new wafer placed in the chamber and the above fabrication process repeated.

13 Claims, 3 Drawing Sheets

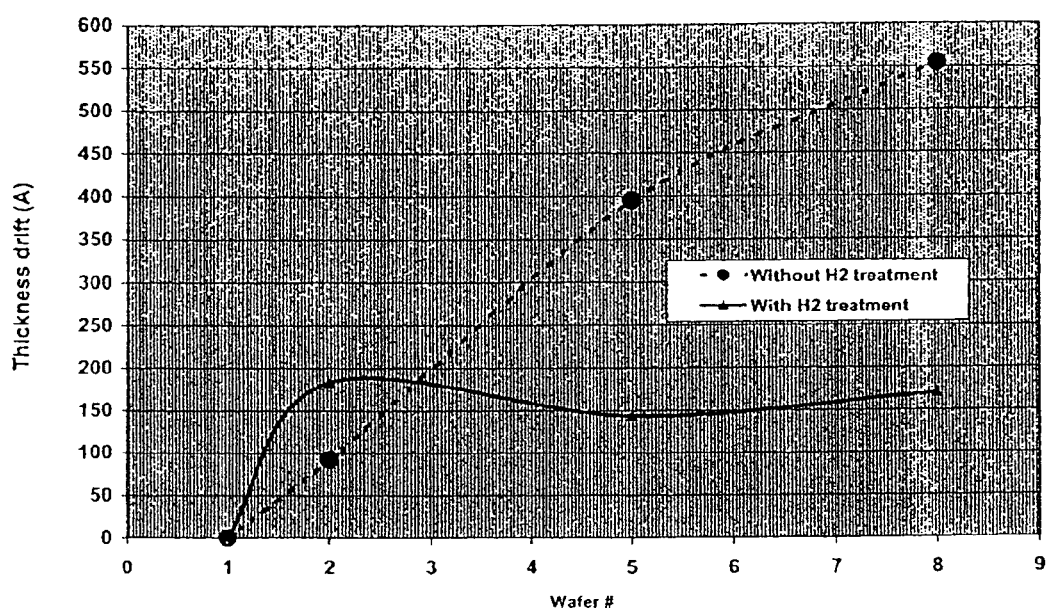
Figure 3. Within Batch Thickness Drift Comparison

RESOLVING OF FLUORINE LOADING EFFECT IN THE VACUUM CHAMBER

BACKGROUND OF THE INVENTION

This invention relates to electronic device fabrication processes. More specifically, the invention relates to resolving the fluorine loading effect in the reaction chamber of a HDP CVD apparatus used for forming dielectric layers in high aspect ratio, narrow width recessed features.

It is often necessary in semiconductor processing to fill high aspect ratio gaps with insulating material. This is the case for shallow trench isolation, inter-metal dielectric layers, passivation layers, etc. As device geometries shrink and thermal budgets are reduced, void-free filling of high aspect ratio spaces (e.g., AR>3:1) becomes increasingly difficult due to limitations of existing deposition processes.

Most deposition methods deposit more material on the upper region than on the lower region of a sidewall and/or form top-hats at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. One such problematic reentrant feature is a narrowing at the top of the gap. The etched sidewalls slope inward near the top of the gap. For a given aspect ratio feature, this increases the ratio of gap volume to gap access area seen by the precursor species during deposition. Voids and seams formation is more likely under these conditions. If the top of the gap prematurely closes off, a chemical etch is required to re-open the gap before more film can be deposited in the gap.

High-density plasma chemical vapor deposition (HDP CVD) is a directional (bottom-up) CVD process that is used for high aspect ratio gap-fill. The method deposits more material at the bottom of a high aspect ratio structure than on its sidewalls. It accomplishes this by directing charged dielectric precursor species downward, to the bottom of the gap. Thus, HDP CVD is not an entirely diffusion-based (isotropic) process.

Nevertheless, some overhang or top-hat formation still results at the entry region of the gap to be filled. This results from the non-directional deposition reactions of neutral species in the plasma reactor and from sputtering/redeposition processes. The directional aspect of the deposition process produces some high momentum charged species that sputter away bottom fill. The sputtered material tends to redeposit on the sidewalls. Limitations due to overhang formation become ever more severe as the width of the gap to be filled decreases and the aspect ratio increases.

Conventional HDP CVD processes rely on plasma etch steps to remove sidewall deposits and top-hats. Typically a fluorine species, such as NF3, is used between dielectric film deposition steps to etch the film. After a layer of dielectric partially fills gaps on a substrate, the fluorine-containing plasma etches the layer to remove top-hats and open the gap for further deposition. However, these etch steps are time-consuming and expensive.

The current gap fill process uses multiple sequences of deposition and etch and this process methodology leaves behind residual fluorine which remains incorporated in trace amounts in the chamber, primarily the ceramic dome. These trace amounts accumulate with time and cause a detrimental fluorine loading effect resulting in a shift in the stack film thickness on the wafer in the process chamber as wafers are processed. The loading effect is mainly caused by fluorine attacking the chamber environment and increases the batch thickness drift as more wafers are produced.

To improve fabrication of advanced technology devices, the art requires better dielectric deposition and etch processes that can fill high aspect ratio features of narrow width and reduce sidewall and top-hat formation without the detrimental fluorine loading effects on drift in the thickness of the deposition as the fabrication processes proceed.

SUMMARY OF THE INVENTION

Bearing in mind the problems and deficiencies of the prior art, it is therefore an object of the present invention to provide a method for filling gaps on a semiconductor substrate using a deposition/etch/deposition process performed in a single chamber wherein the fluorine loading effect in the chamber is minimized and wafers are provided having less deposition thickness variations. The described process transitions from deposition to etch step, as well as the new hydrogen treatment step of the invention, by changing the gas mixture composition along with other chamber parameters as the process proceeds.

Still other objects and advantages of the invention will in part be obvious and will in part be apparent from the specification.

The above and other objects, which will be apparent to those skilled in the art, are achieved in the present invention which is directed to a deposition/etch method for filling gaps in a semiconductor substrate comprising:

providing a semiconductor substrate having a gap to be filled in a high density plasma chemical vapor deposition (HDP CVD) reaction chamber;

introducing a dielectric process gas into the chamber;

depositing a dielectric in the gap using a HDP CVD process;

introducing hydrogen or other reducing agent into the reaction chamber and forming a hydrogen plasma and maintaining the plasma for a sufficient time to treat the chamber and the substrate;

introducing an etchant into the reaction chamber and forming an etchant plasma to etch the gap;

optionally introducing hydrogen or other reducing agent into the reaction chamber and forming a hydrogen plasma and maintaining the plasma for a sufficient time to scavenge residual etchant and treat the chamber and the substrate; and repeating the above steps until the gap is filled and removing the gap filled semiconductor substrate from the reaction chamber.

The present invention provides methods of improving gap-fill and the methods include treating a semiconductor substrate with a hydrogen plasma after depositing a dielectric film on the substrate and then etching the substrate with a fluorine plasma, and repeating the above steps until the gap is filled.

One aspect of the invention involves providing a semiconductor substrate in a process chamber of a high density plasma chemical vapor deposition reactor, exposing the substrate to a process gas typically comprising a silicon-containing precursor to thereby grow a dielectric film via high density plasma chemical vapor deposition, and treating the deposited substrate with a hydrogen plasma prior to a fluorine etch operation. The dielectric film deposition, hydrogen plasma treatment and fluorine etch cycles may be repeated until a gap on the substrate is substantially filled. It will be appreciated by those skilled in the art that the plasmas will also contact and treat the walls and other parts of the chamber at the same time and that this is an important feature of the invention In preferred embodiments, hydrogen treatment times range from between about 5 to 300 seconds per cycle and having a hydrogen flow rate between about 200 sccm-3000 sccm. According to various embodiments, the substrate may be biased (e.g., 1000-7000 W) or unbiased and a LF/MF source power of e.g., 2000-13000 W is typically used during the hydrogen treatment.

In preferred embodiments, the substrate is exposed to the process gas for a time less than or equal to about 10 seconds. The flow rate of the silicon-containing precursor may range between about 40 sccm and 200 sccm.

The methods of this invention may be used to fill high aspect ratio gaps, including gaps having aspect ratios ranging from 3:1 to 10:1.

BRIEF DESCRIPTION OF THE DRAWINGS

FIG. 3 is a graph showing the deposition thickness drift on a wafer as a function of the number of wafers processed for a method of the invention versus a method not of the invention.

DETAILED DESCRIPTION OF THE INVENTION

The present invention relates to chemical vapor deposition processes that can fill high aspect ratio (typically at least 3:1), narrow width gaps with significantly reduced thickness drift of the deposition layer. The deposition processes described involve treating a semiconductor substrate with a hydrogen plasma after depositing dielectric film on the substrate. A fluorine etch step is then performed preferably followed by treatment with a hydrogen plasma. The method provides improved control of the process and uniformity of the deposited film.

Although the present invention is described below in the context of high density plasma chemical vapor deposition (HDP CVD) gap fill, the invention is not so limited and may be used with other dielectric film deposition techniques such as PECVD, SACVD, ALD, PDL and other such processes.

Most deposition methods either deposit more material on the upper region than on the lower region of a sidewall or form cusps (also called top-hats) at the entry of the gap. As indicated above, conventional HDP CVD gap fill results in less sidewall and top-hat formation than isotropic processes. Nevertheless, some top-hat formation and overhang still results at the entry region of the gap to be filled.

To remove sidewall and top-hat deposits and keep the gap open for further deposition, conventional HDP CVD processes typically use a multi-cycle deposition process—etch process. Each cycle includes a deposition step followed by an etch step. Typically, fluorine species are used in the etch step. These fluorine steps load the chamber with fluorine species, however, and detrimentally affect the uniformity of the thickness of the dielectric deposit.

The methods of the present invention provide improved gap-fill control and deposition uniformity.

Figure 1:
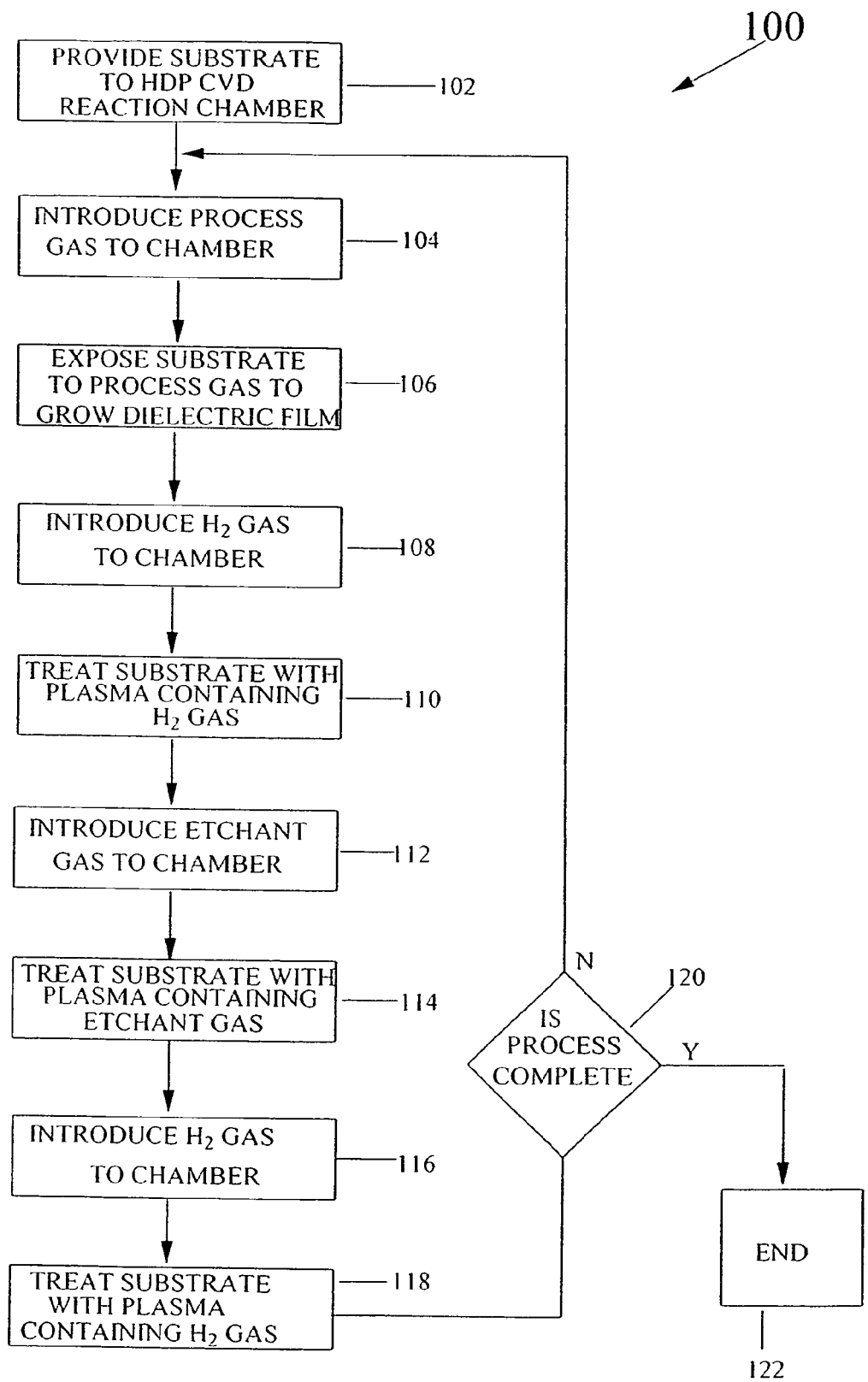
FIG. 1 is a process flow diagram depicting a method according to one embodiment of the invention.

FIG. 1 is a process flow sheet depicting a method according to one embodiment of the present invention. As shown, a deposition process 100 begins at operation 102 in which a substrate containing a gap is provided to a reaction chamber, such as a HDP CVD reaction chamber. Providing the substrate to the reactor may involve clamping the substrate to a pedestal or other support in the chamber. For this purpose, an electrostatic or mechanical chuck may be employed.

After the substrate is provided to the reaction chamber, a process gas is introduced at operation 104. The process gas includes dielectric precursor species such as high vapor pressure silicon-containing compounds. The gas may also include one or more dopant precursors. Molecular oxygen or another oxygenated compound will often be present. Sometimes, though not necessarily, an inert carrier gas is present.

The substrate is then exposed to the deposition process to thereby grow a dielectric film by HDP CVD at operation 106. To deposit the dielectric film, the process gas is ionized to form a plasma and a bias is preferably applied to the substrate to direct charged precursor species from the plasma onto the substrate and grow a dielectric film in the gap. The substrate is exposed to the process gas for a sufficient time to grow a substantially void free dielectric film in the gap. As noted above the deposition step, as well as in all the plasma treatment steps, the plasma contacts both the substrate and the walls and other parts of the chamber at the same time.

Hydrogen gas is then introduced in operation 108. The substrate is then treated with a hydrogen plasma in operation 110. Treatment with a hydrogen plasma involves ionizing the gas to form a plasma and exposing the substrate to the plasma-containing gas for a sufficient period of time and bias may apply to the process. In a preferred embodiment, the treatment gas does not include gases other than hydrogen. However, the hydrogen can be combined with other gases such as $N_2$, He, $O_2$, and the like, to provide other desired effects. Treatment times may vary depending on the application, with a typical time between 5-300 seconds, preferably 10 and 30 seconds.

An etchant preferably a fluorine containing material is then introduced into the chamber in step 112 and the substrate is then etched by forming a plasma in step 114. This step is optionally followed by introducing hydrogen to the chamber in step 116 and a hydrogen plasma treatment in step 118. Other gases may be used in combination with the hydrogen as above in step 110.

The process is then queried in step 120 to determine if the deposition/etch process is completed. If it is, the process ends in step 122. If the process is to continue, the steps 104-118 are then repeated until the gap is substantially filled and the process completed at step 122.

The present invention may be implemented in a HDP CVD reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In the method of the invention, silicon oxide deposition, hydrogen treatment and fluorine etching occur in one reactor. While in process, each wafer is held in place by a pedestal, wafer chuck and/or other wafer holding apparatus. For certain operations in which the wafer is to be heated, the apparatus may include a heater such as a heating plate. An example of a suitable reactor is the Speed™ reactor, available from Novellus Systems of San Jose, Calif.

Figure 2:
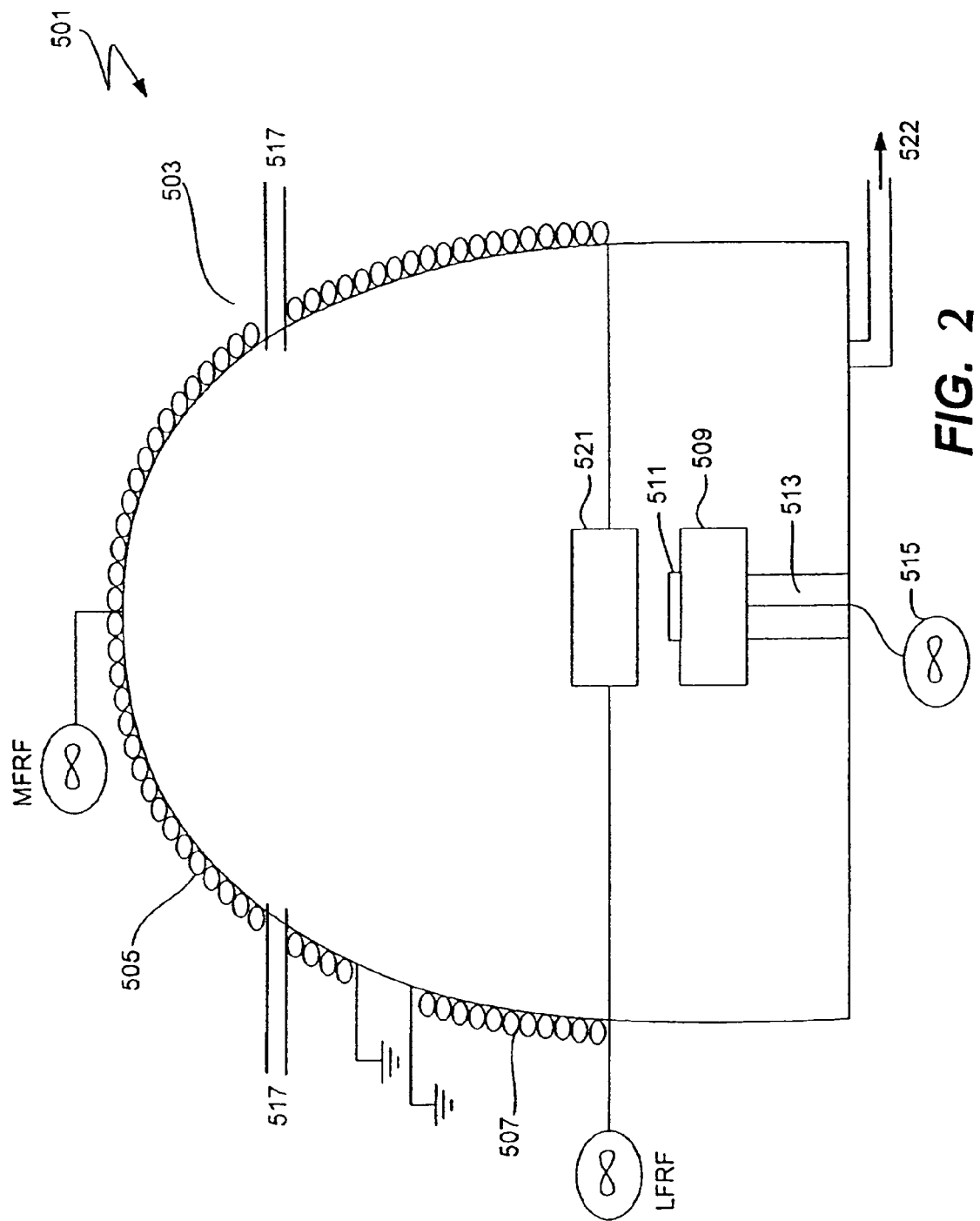
FIG. 2 is a block diagram depicting some components of a suitable CVD reactor for performing HDP CVD in accordance with this invention.

FIG. 2 provides a simple block diagram depicting various reactor components arranged as may be arranged in a conventional reactor. As shown, a reactor 501 includes a process chamber 503 which encloses other components of the reactor and serves to contain the plasma. In one example, the process chamber walls are made from aluminum, aluminum oxide, and/or other suitable material. The embodiment shown in FIG. 2 has two plasma sources: top RF coil 505 and side RF coil 507. Top RF coil 505 is a medium frequency or MFRF coil and side RF coil 507 is a low frequency or LFRF coil. In the embodiment shown in FIG. 2, MFRF frequency may be from 430-470 kHz and LFRF frequency from 340-370 kHz. However, the invention is not limited to operation in reaction chambers with dual sources, nor RF plasma sources. Any suitable plasma source or sources may be used.

Within the reactor, a wafer pedestal 509 supports a substrate 511. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 513 for supplying heat transfer fluid controls the temperature of substrate 511. The wafer chuck and heat transfer fluid system can facilitate maintaining the appropriate wafer temperatures.

A high frequency RF of HFRF source 515 serves to electrically bias substrate 511 and draw charged precursor species onto the substrate for the deposition reaction. Electrical energy from source 515 is coupled to substrate 511 via an electrode or capacitive coupling, for example. Note that the bias applied to the substrate need not be an RF bias. Other frequencies and DC bias may be used as well.

The process gases are introduced via one or more inlets 517. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 521, which may or may not direct the gases toward the substrate surface. Injectors may be connected to the primary gas ring 521 to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate. Process gases exit chamber 503 via an outlet 522. A vacuum pump (e.g., a turbomolecular pump) typically draws process gases out and maintains a suitably low pressure within the reactor.

For the hydrogen treatment step of the invention, the hydrogen plasma may be generated by a remote plasma generator. The reactive species generated from the plasma may be conveyed to chamber 503 through a feed tube. The materials used to contain the plasma and feed tube must be resistant to attacks by the plasma and the feed tube should be kept as short as practical. Generating the plasma in a remote chamber does not subject the deposition chamber components to the temperature, radiation, or bombardment of a plasma formed in situ and has operating advantages which are apparent to those skilled in the art.

Hydrogen Treatment Parameters

Gas

In a preferred embodiment, hydrogen gas is introduced to the reactor to create the plasma-containing hydrogen gas comprising substantially molecular hydrogen.

Flow Rate

The hydrogen gas may be introduced to the chamber at any suitable flow rate. In some embodiments, the flow rate of the hydrogen is relatively high. In a preferred embodiment for both 200 and 300 mm wafer, the flow rates ranges between about 200 sccm and 3000 sccm. In a particularly preferred embodiment, the flow rate is about 2000 sccm.

Hydrogen Plasma Source Power

The hydrogen plasma source power should be high enough to sustain a plasma and low enough so that the effect of the $H^+$ ions does not overwhelm that of the $H_2$ radicals. Note that preferred RF power will depend on the substrate size (e.g., 200 or 300 mm diameter wafer) and the requirements of the specific process being used. In a preferred embodiment using the dual RF plasma source described above for both 200 and 300 mm, the power of each of the LFRF and MFRF plasma sources should be between 2000 W and 13000 W. In a particularly preferred embodiment, the power of each source is 6000 W.

Temperature and Pressure

Substrate temperature and chamber pressure during hydrogen treatment are generally within the ranges commonly used during HDP CVD processes. Temperature values may range from about 200° C. and 1,000° C. A preferred range during hydrogen treatment is between about 400° C. and 550° C. and a particularly preferred range is between about 480° C. and 500° C. Pressure is preferably maintained at a value below 500 mTorr, more preferably between about 5 and 500 mTorr.

Time

Hydrogen treatment time should be long enough to achieve a stable plasma within the reactor. Note that preferred treatment time will depend on the substrate size (e.g., 200 or 300 mm diameter wafer) and the requirements of the specific process being used. In a preferred embodiment, the substrate is exposed to hydrogen for a time ranging from about 5 to 300 seconds. In a particularly preferred embodiment, the substrate is exposed to hydrogen for a time ranging from about 10 to 30 seconds.

Substrate

The substrate may be any suitable substrate, typically a semiconductor wafer. Typical substrates are 200 mm or 300 mm silicon wafers. It should be noted that unless otherwise noted, process parameters given are specific to a 300 mm wafer, but one of skill in the art would understand how to adjust these parameters to process a 200 mm wafer.

In some embodiments, the substrate provided to the chamber is bare. For the purposes of this application, bare substrates are semiconductor substrates that do not contain heterogeneous layers of material on the semiconductor material. In some embodiments, the bare substrate may be a new substrate, i.e. a semiconductor substrate that has not undergone previous processing. In some embodiments, the bare substrate may be recycled, i.e., a semiconductor substrate that has been stripped and substantially cleaned of any material other than the semiconductor. In some embodiments, the semiconductor substrate may include a SiN liner layer but no dielectric material. In some embodiments, the substrate includes a dielectric/etch layer.

Substrate Bias

A HFRF power source or other source may be used to bias the substrate. Substrates are typically biased during deposition and etch operations to direct charged species downward, to the bottom of the gap.

It is believed that the application of bias power helps keeps the gap open and further lowers top-hats by a mechanical etch effect. The etch rate is very low, around 50 Å/min, enough to remove a small amount of film and lower the top-hats.

For the hydrogen plasma treatment step, the HF bias power is preferably between about 0 W and 8000 W for both 200 and 300 mm wafer. A particularly preferred power for the 300 mm is about 1000 W.

Deposition Parameters

Gas

The components of the process gas should be chosen to produce the composition of the dielectric to be deposited. As is known to those of skill in the art, many suitable precursor gases are widely available, some of which include both a source of silicon and oxygen. Examples of suitable silicon-containing precursor molecules include the following: silane ($SiH_4$), $Si_2H_6$, TEOS (tetraethyl orthosilicate), TMCTS (tetramethyl-cyclotetrasiloxane), OMCTS (octamethyl-cyclotetrasioxane), methyl-silane, dimethyl-silane, 3MS (trimethylsilane), 4MS (tetramethylsi lane), TMDSO (tetramethyl-disi loxane), TMDDSO (tetramethyl-diethoxyl-disiloxane), DNDMS (dimethyl-dimethoxyl-silane) and mixtures thereof. During deposition, the process decomposes the silicon-containing reactant to form a silicon-containing gas and plasma phase species, which can react on the surface of the substrate.

Examples of suitable oxygen-containing precursor molecules include the following: oxygen, nitric oxide (NO), and nitrous oxide ($N_2O$).

For doped dielectrics, the process gas may include a dopant precursor such as a boron-containing gas, a phosphorus-containing gas, or a mixture thereof.

Often, the process gas employed for deposition will also include a carrier gas such as helium or argon. Still other process gases such as nitrogen, ammonia, and lower hydrocarbons (such as methane, ethylene, and acetylene) may be employed depending on the composition of the dielectric to be deposited.

Flow Rate

Flow rate of the silicon-containing precursor gas typically ranges from about 40-200 sccm. As discussed above, in preferred embodiments, the flow rate is high to achieve a high deposition rate process. Thus, in a preferred embodiment the flow rate of the silicon-containing precursor gas is between about 80 and 200 sccm. For silane, a flow rate of about 100 sccm is particularly preferred.

Time

Deposition time will depend on the requirements of the specific process being used.

Temperature and Pressure

The temperature of the substrate within the process vessel should be maintained sufficiently high to ensure that the dielectric deposition reaction proceeds efficiently. Hence, the temperature preferably resides at values between about 200 and 1000° C. and more preferably between about 450 and 750° C. In particularly preferred embodiments, the substrate temperature is maintained between about 480 and 650° C. For deposition, the pressure within the reactor during HDP CVD is typically maintained at a level no greater than about 100 mTorr, more preferably between about 2 and 30 mTorr.

Plasma Source and Bias Power

The high frequency electrode (for biasing the substrate) preferably generates a power of between about 0 and 10 kilowatts during deposition. For many deposition reactions suitable for this invention, the total power of the LF and MF sources (i.e. MF+LF) ranges from 2 kW to 13 kW for both 200 and 300 mm system. The LF/MF power split is tuned to obtained good, uniform gap fill from center to edge.

Referring now to FIG. 3 a graph shows the thickness drift of deposition on a wafer as the number of wafers processed increases in the chamber. Thus, for wafer no. 1, there is no thickness drift for a method not of the invention as shown by curve A compared to the method of the invention shown by curve B. When wafer 1 is completed being processed, another wafer, wafer 2, is placed in the chamber and the process repeated. As can be seen in curve A the thickness drift for a method without hydrogen treatment has a thickness drift of only about 100 Å whereas the thickness drift of a wafer with hydrogen treatment according to the invention has a thickness drift of about 175 Å as shown in curve B. However, as the process processes more and more wafers, it can be seen that for wafer no. 5 the thickness drift is 400 Å (curve A) for a method without the hydrogen treatment of the invention vs. a thickness drift of only 150 Å (curve B) for a wafer processed with the hydrogen treatment of the invention. The results are even more dramatic after 8 wafers are treated in that a wafer not treated accordingly to the method of the invention has a thickness drift of 550 Å (curve A) vs. a thickness drift of only about 160 Å (curve B) for a wafer treated with the hydrogen treatment of the invention.

The method used to obtain the data for curve B of FIG. 3, used the method as shown in FIG. 1. The source gas was silicon containing and the wafer was 300 mm. The method used to process the wafers shown for curve A, also used the method of FIG. 1 except that steps 108 and 110 of the invention were not used. These steps are the method of the invention where hydrogen gas is introduced to the chamber after the dielectric film has been deposited on the wafer and a hydrogen plasma is then formed and the substrate and chamber are treated with the plasma. The method of the invention using a hydrogen treatment after the deposition step and before the etching step provides enhanced reduction in the thickness drift of deposition on the wafer.

While this invention has been described in terms of a few preferred embodiments, it should not be limited to the specifics presented above. Many variations on the above-described preferred embodiments, may be employed. Therefore, the invention should be broadly interpreted with reference to the following claims.

The invention claimed is:

1. A deposition/etch method performed in a single reaction chamber for filling gaps in a semiconductor substrate comprising the following steps:

providing a semiconductor substrate having a gap to be filled in a high density plasma chemical vapor deposition (HDP CVD) reaction chamber;

introducing a dielectric process gas into the chamber;

depositing a dielectric in the substrate gap using a HDP CVD process;

after the dielectric deposition in the substrate gap step, introducing hydrogen into the reaction chamber and forming a hydrogen plasma and maintaining the plasma for a sufficient time to treat the chamber and the dielectric in the substrate gap;

after the hydrogen treatment step, introducing an etchant into the reaction chamber and forming an etchant plasma to etch the dielectric in the substrate gap;

after the etchant step, introducing hydrogen into the reaction chamber and forming a hydrogen plasma and maintaining the plasma for a sufficient time to scavenge residual etchant and treat the chamber and the dielectric in the substrate gap; and repeating the above steps starting with introducing a dielectric process gas into the chamber until the substrate gap is filled with dielectric and removing the substrate gap filled semiconductor substrate from the reaction chamber.

2. The method of claim 1 further comprising that the hydrogen plasma can be generated by a remote or downstream plasma source.

3. The method of claim 1 further comprising that the hydrogen can be combined with other gases including N2, He, O2, Ar to provide other desired effects.

4. The method of claim 1, wherein treating the substrate with a hydrogen plasma comprises exposing the substrate to a plasma-containing hydrogen gas for a time ranging from about 5 and 300 seconds.

5. The method of claim 1, wherein treating the substrate with a hydrogen plasma comprises introducing hydrogen gas having a flow rate between about 200 sccm and 3000 sccm to the reactor.

6. The method of claim 5, wherein the flow rate is about 2000 sccm.

7. The method of claim 1, wherein treating the substrate with a hydrogen plasma comprises applying a bias to the substrate.

8. The method of claim 7, wherein the bias applied is between about 0 and 3000 W.

9. The method of claim 1, wherein the flow rate of the dielectric process gas is between about 80 sccm and 200 sccm.

10. The method of claim 9, wherein the dielectric process gas is silicon containing.

11. The method of claim 10, wherein the flow rate of the dielectric process gas is between about 80 sccm and 200 sccm.

12. The method of claim 1 wherein the dielectric process gas is silicon containing.

13. The method of claim 12 wherein the etchant is a fluorine containing species.

* * * * *